United States Patent [19]

Gipstein et al.

[11] 3,779,806

[45] Dec. 18, 1973

[54] ELECTRON BEAM SENSITIVE POLYMER T-BUTYL METHACRYLATE RESIST

[75] Inventors: Edward Gipstein; William Ainslie Hewett, both of Saratoga, Calif.; Harold A. Levine, Poughkeepsie, N.Y.

[73] Assignee: International Business Machines Corporation, Armonk, N.Y.

[22] Filed: Mar. 24, 1972

[21] Appl. No.: 237,875

[52] U.S. Cl. ................ 117/212, 96/36.2, 96/115 R, 117/8, 117/93.31

[51] Int. Cl. ........................... B44d 1/18, G03c 1/64

[58] Field of Search ..................... 117/8, 93.31, 212; 96/115 R, 36.2

[56] References Cited

UNITED STATES PATENTS

| | | | |
|---|---|---|---|
| 3,535,137 | 10/1970 | Haller et al. | 117/93.31 X |
| 3,696,742 | 10/1972 | Parts et al. | 117/93.31 X |
| 3,650,796 | 3/1972 | Jackson et al. | 117/8 X |
| 3,607,382 | 9/1971 | Henker | 117/8 X |
| 3,436,468 | 4/1969 | Haberecht | 117/93.31 X |
| 3,392,051 | 7/1968 | Caswell et al. | 117/93.31 X |

*Primary Examiner*—William D. Martin
*Assistant Examiner*—Shrive P. Beck
*Attorney*—Henry Powers et al.

[57] ABSTRACT

Patterns, such as etch resistant resists, masks, are formed by degradation of a t-butyl methacrylate polymer coating, or film, under an electron beam in a predetermined pattern, followed by removal with a solvent, of the electron degraded product in the exposed areas.

16 Claims, No Drawings

ELECTRON BEAM SENSITIVE POLYMER T-BUTYL METHACRYLATE RESIST

FIELD OF THE INVENTION

This invention relates generally to electron beam sensitive resists, and more particularly to the formation of polymeric resist masks which are useful in the fabrication of integrated circuits, printing plates and the like.

BACKGROUND OF THE INVENTION

The use of electron beam degradable polymers for the formation of resist masks has been proposed heretofore, as for example, U.S. Pat. No. 3,535,137, granted on Oct. 20, 1970 to *Haller et al.* which specifically teaches the use of poly-methyl methacrylate for such purpose and which contains a quaternary carbon in the backbone of the polymer. Generally, such resist masks are prepared by coating a film, or layer, of the polymer (e.g., poly-methyl methacrylate) on a substrate, exposing portions of the film to an electron beam in a predetermined pattern of the desired mask under sufficient exposure to degrade the polymer in the exposed areas. Subsequently, the electron beam degraded polymers are removed from the exposed areas with a solvent which has a marked differential solubility for the degraded products and the unexposed polymer.

Studies, such as those set forth by A. R. Shultz et al. in their article "Light Scattering and Viscosity Study of Electron-Irradiated Polystyrene and Polymethacrylates," pp. 495–507, Journal of Polymer Science, v. XXII (1956) would appear to suggest that degradation of the methacrylate polymer, under irradiation of an electron beam, occurs by scission of the polymers backbone at the location of the quaternary carbon compounds.

However, the use of alkyl methacrylates, in the formation of beam degradable resist masks, has been restricted to the methyl ester, as in the aforesaid U.S. Pat. No. 3,535,137, since it has been understood in the art that the use of higher ester moieties, such as ethyl, propyl, etc., would introduce additional primary carbon atoms which would act as cross-linking sites under electron beam irradiation, and also the use of higher ester moieties would result in less decomposition of the polymer. For these reasons, no suggestion could be found in the prior art for the use of any other of the methacrylates but the poly-methyl methacrylate polymer for the electron beam formation of resist masks.

SUMMARY OF THE INVENTION

In accordance with broad aspects of this invention, it comprehends the formation of resist masks by degradation of a predetermined pattern area of a tertiary-butyl methacrylate polymer, under electron beam irradiation, with removal of the degradation products with a solvent having a high solubility therefore and a minimum solubility for the unexposed portions of the polymer. It was found in accordance with studies of this polymer, that contrasted with poly-methyl methacrylate where degradation of the polymer under electron irradiation is understood to be restricted to scission at the quaternary carbon positions in the polymer backbone, degradation of the tertiary-butyl methacrylate polymers also appears to involve splitting off of the t-butyl ester moiety, possibly forming gaseous isobutene, followed by intermolecular reaction of adjacent acyl groups into an anhydride, with as yet an undetermined termination of the residual radicals of the degradated polymer chain. In any event, the degradation products comprise varied portions of the original polymer, which are of lower molecular weight that enable their removal by solvent having a differential solubility between them and the unexposed area of the polymer which are markedly less soluble in the solvent.

In general, homopolymers and copolymers to t-butyl methacrylate can be used in which the resist contains at least about 25 mole percent, and preferably about 50 mole % of the t-butyl methacrylate units. Typical of such copolymers is the t-butyl methacrylate/methyl methacrylate copolymer. Normally, these resist polymers will have a number average molecular weight (Mn) in the range of about 25,000 to about 1,000,000, and a weight average molecular weight (Mw) in the range of about 50,000 to about 2,000,000.

The t-butyl methacrylate polymer resist is normally coated on a substrate from a solution thereof (compatible with the substrate) in any appropriate manner, as by spin casting, and then dried to remove all volatile matter. Such drying can be supplemented by additional drying at elevated temperatures (e.g., 160°–170° C.) to insure removal of volatile substrates and to consolidate the polymer coating.

Various substrates can be employed as supports for the polymer resist of this invention. For example, in application of the polymer resist in the fabrication of semiconductor devices, or integrated circuits, the substrate can comprise semiconductor wafers (or chips) overcoated with oxides and nitrides (e.g., silicon oxide/silicon nitride for diffusion masks and passivation) and/or metals normally employed in the metallization steps for forming contacts and conductor patterns on the semiconductor chip.

After drying of the polymer resist it is then exposed to an electron beam in a predetermined pattern to delineate the necessary patterns required in processing, e.g., integrated circuits. The specific exposure flux required is not critical and will normally be dependent on the composition and thicknesses of the polymer resist. Normally, for exposure of polymer resist in thickness of 6,000 to 20,000 Angstroms, the exposure flux will be in the range of about $3.0\times10^{-6}$ to about $6.0\times10^{-6}$ coulombs/cm.$^2$ at an accelerating potential of 15 to 30 kv.

After exposure, the electron beam degraded products, (of lower molecular weights), in the exposed areas are removed with a suitable solvent (e.g., isopropylalcohol, cyclohexanone and the like) which has a markedly lower solubility for the unexposed areas of the polymer resist. The use of these t-butyl methacrylate polymer resists were found capable of producing high resolution patterns heretofore unavailable with prior art resists.

Accordingly, it is an object of this invention to provide a process for the formation of polymeric resists which can be delineated in high resolution patterns utilizing electron beam or other corpuscular irradiation.

Another object of this invention is to provide a process for the formation of high resolution polymeric positive resists utilizing an electron beam activated polymer of tertiary-butyl methacrylate which exhibits excellent film-forming characteristics, differential solubility in solvents between exposed and unexposed areas, resistance to various etch solutions and ready removal of unexposed portions with simple solvents.

The foregoing and other objects, features and advantages of the invention will be apparent from the more particular description of the preferred embodiments.

DESCRIPTION OF THE PREFERRED EMBODIMENTS

The tertiary-butyl methacrylate polymers employed in accordance with this invention can be prepared by techniques well-known in the art. For example, a polymer identified below as Polymer A, can be prepared by the polymerization of t-butyl methacrylate monomer at room temperature. The polymerization can be carried out in a one liter four-necked reaction flask heated about 100° C. prior to the introduction of solvent and polymer. Oxygen can be excluded by maintaining a continuous flow of purified argon over the solution during the polymerization. A solution of 32.5 g (0.23 mole) of t-butyl methacrylate monomer in 500 ml dry toluene contained in the flask is cooled to −50° C. and 0.16 g ($2.5\times 10^{-3}$ mole) of 1.6 M n-butyllithium catalyst was added. The mixture was stirred 30 minutes, warmed to room temperature and poured into three liters of vigorously stirred water to precipitate the polymer. The polymer is then purified by repeated precipitation from acetone/water followed by vacuum drying at 50°–60° C. for 72 hours to give 24.5 g (74.4 percent) of white product. The polymer was then characterized by infra-red, NMR, GPC, glass transition temperature ($T_g$) and elemental analysis. The results were as follows:

Isotactic Poly-t-Butyl Methacrylate, Polymer A

Glass Transition Temperature, Tg °C[a]

| Method: | Tg, °C. |
|---|---|
| TMA (Thermal Mechanical Analysis) | 75.0 |
| DSC (Differential Scanning Analysis) | 78.3 |

Gel Permeation Chromatographic Analysis:

| $\overline{M}n$ | $\overline{M}w$ | $\overline{M}w/\overline{M}n$ |
|---|---|---|
| 300,000 | 356,000 | 1.19 |

Elemental Analysis for $[C_8H_{14}O_2]$,

| | % Calculated | % Found |
|---|---|---|
| C | 67.57 | 67.47 |
| H | 9.93 | 9.84 |
| O | 22.50 | 22.68 |

a = 70° (TMA), 97° (DSC) for isotactic polymer, Azimov et al., Polymer Sci. USSR 1, 929 (1965)

An atactic poly-t-butyl methacrylate (identified as Polymer B below) was polymerized in a 250 ml 4-necked flask under a continuous flow of argon. A stirred mixture of 71.1 g (0.50 mole) t-butyl methacrylate monomer in 72 ml of dry toluene was heated to 70° C. and 0.12 g ($4.9\times 10^{-4}$ mole) benzoyl peroxide catalyst was added and the polymerization was continued for 15 hours. The viscous mixture obtained was poured into 6 liters of vigorously stirred water to precipitate a white powder. The polymer was purified by repeated precipitation from acetone/water mixture, collected and dried under vacuum at 50°–60° for 72 hours to give 56 g (78.8 percent) white powder. This product was characterized as follows: Tg 95° C. (TMA), 96° C. (DSC), (lit 118° C., 130° C., Azimov et al.) GPC analysis indicated the following molecular distribution:

| $\overline{M}w$ | $\overline{M}n$ | $\overline{M}w/\overline{M}n$ |
|---|---|---|
| 359,950 | 177,590 | 2.03 |

EXAMPLE I

The above Polymers A & B and a third Polymer C, were spin-coated from a 9–12 wt. percent solution in methyl isobutyl ketone onto an oxidized surface of a silicon semiconductor substrate rotating at 2,500 – 6,000 rpm.

Polymer C in this example, comprised an isotactic t-butyl methacrylate having a $T_g$ (TMA) of 75.5° C., a number average molecular weight ($M_n$) of 29,700 and a weight average molecular weight ($M_w$) of 38,200.

After drying of the coated substrate with a prebake at 165° C. for 60 minutes, the substrates were then tested for minimum exposure flux (MEF) by raster box sensitometry to determine the minimum intensity of an electron beam required in order to clean out the exposed area of the polymer. For this test, a 20,000 Angstrom diameter electron beam of current of $1-2\times 10^{-9}$ amps was scanned 1,2,4,6, 8 etc. times over a succession of 12 mil by 12 mil areas of the polymer with subsequent development with solvent and at times specified in Table B.

| Polymer | Substrate | MEF (Coul/cm²) | Developing conditions | Unexposed Polymer thicknesses, angstroms Initial | Final |
|---|---|---|---|---|---|
| A | 1 | $3.0\times 10^{-6}$ | 9 minutes in isopropylalcohol IPA: $H_2O$ : : 85 : 15. | 12,300 | 6,600 |
| A | 2 | $4.8\times 10^{-6}$ | 2 minutes IPA: $H_2O$ : : 9 : 1 | 7,900 | [1]5,000 |
| B | 3 | $5.8\times 10^{-6}$ | 2.5 minutes cyclohexanone | 10,800 | 7,700 |
| B | 4 | $5.8\times 10^{-6}$ | 3 minutes IPA | 10,900 | 7,500 |
| B | 5 | $4.4\times 10^{-6}$ | 5 minutes IPA | 9,900 | 5,900 |
| B | 6 | $4.5\times 10^{-6}$ | 3.5 minutes cyclohexanone | 10,800 | 5,800 |
| C | 7 | $6.3\times 10^{-6}$ | 3.5 minutes IPA | 10,700 | 7,700 |

[1] Estimated.

For application of the Polymer B resist, the oxidized surface of the substrate to be coated was pre-treated with Bistrimethylsilyl acetamide in order to enhance adhesion of the polymer to the oxidized surface of the substrate.

Any tendency of polymer redeposition during development in the opened resist pattern areas can be readily prevented by spray-rinsing the developer-wet processed wafers with nitrogen atomizer sprayed acetonitrile for three to five seconds before nitrogen blow-dry.

EXAMPLE II

A 50/50 co-polymer of t-butyl methacrylate and methyl methacrylate was polymerized from a mixture of 21.9 g (0.15 mole) t-butyl methacrylate monomer and 15.4 g (0.15 mole) methyl methacrylate monomer at 80° C. in 44 ml. of dry toluene with 0.075 g ($3.1\times 10^{-4}$ mole) of benzoyl peroxide catalyst. After 15 hours, the polymer was recovered by pouring the mixture into four liters of rapidly stirred water. The polymer was purified by repeated precipitation from acetone/water solution followed by vacuum drying at 50°–60° C. for 72 hours to give 25 g (67 percent conversion) of white product. This product was characterized as indicated below:

Elemental Analysis for a $[C_{13} H_{22} O_4]$ n

| | % Calculated | % Found |
|---|---|---|
| C | 64.44 | 64.47 |
| H | 9.15 | 9.84 |
| O | 26.41 | 22.68 |
| T°g (TMA) | 81 ± 5° C. | |

GPC Analysis:

| $\overline{M}_w$ | $\overline{M}_n$ | $\overline{M}_w/\overline{M}_n$ |
|---|---|---|
| 947,900 | 102,630 | 8.26 |

A 12 weight percent solution of the co-polymer in Cellosolve acetate was spin casted on the oxidized surface of various silicon semiconductor wafers and then prebaked at 165° C. for thirty minutes with the following spin speed v. s. film thickness relationship:

| RPM | Thickness, Angstrom |
|---|---|
| 2,000 | 12,200 |
| 4,000 | 9,200 |
| 6,000 | 7,500 |

The above polymer resist coated wafers were then exposed to a 20,000 Angstrom diameter electron beam in raster box sensitometry tests to determine their MEF, with development for 90 seconds in stirred cyclohexanone plus a 5 second spray rinse with acetonitrile. The co-polymer showed MEF values of 6.0 to $6.2 \times 10^{-6}$ coul/cm$^2$.

EXAMPLE III

A 80/20 t-butyl methacrylate/methyl methacrylate co-polymer was formed by co-polymerizing a mixture of 34 g (0.24 mole) of t-butyl methacrylate monomer and 6 g (0.06 mole) methyl methacrylate monomer in 43 mls of toluene which was heated for 24 hours at 50° C. with 0.05 ($3 \times 10^{-4}$ mole) of azoisobutyronitrile (AIBN) as a catalyst. The co-polymer was worked up as in Example II above to give 18 g (45 percent conversion) of white co-polymer.

The elemental analysis for this 80/20 co-polymer was as follows:

| | % Calculated | % Found |
|---|---|---|
| C | 66.05 | 66.57 |
| H | 9.95 | 9.79 |
| O | 24.39 | 24.0 |

In raster box sensitometry tests, this co-polymer showed an MEF value of $4.5 \times 10^{-6}$ coul/cm$^2$.

In the evaluation of the t-butyl methacrylate resist polymers of this invention, it was found that coatings of the polymer on thermal oxidized surfaces of silicon semiconductor substrates, could be successfully exposed in one pass at moderate current of 300 nanoamps at 15 kv with a round electron beam of 20,000 Angstroms diameter to yield after suitable processing, as described above, high resolution adherent, resist geometry capable of withstanding conventional oxide etching process conditions and solutions conventionally employed in fabrication of semiconductor devices. Such oxidized silicon wafers coated with the resist polymers of this invention have been etched, after electron beam exposure, with buffered hydrofluoric acid solution, 7:1, to yield after simple solvent stripping, clean oxide-etched geometry with excellent edge acuity when observed at high resolution 1,000X microscopy, with no evidence of resist adhesion failure to the substrate of pin-holing due to to etching penetration of the resist imagery.

Similarly, acid cleaned P-thermal oxidized silicon wafers coated with t-butyl methacrylate resist polymer were successfully exposed in one pass with a 50 micro-inch square shaped electron beam pattern generator (as more fully disclosed in U.S. Pat. No. 3,644,700 granted to R. W. Kruppa et al. on Feb. 22, 1972) at a beam current of 60± 5 nanoamps in a single pass mode. After suitable processing, etching and stripping, a high quality clean FET pattern was observed on the oxide, comparable in properties to the oxide etch patterns described above.

In comparison to the foregoing, a poly-methyl methacrylate polymer resist, as disclosed in the aforesaid U.S. Pat. No. 3,535,137, required two passes at 300 nanoamp beam current in a round beam 80 microinch spot electron beam generated pattern for a usable resist exposure. In the square beam system of the aforesaid U.S. Pat. No. 3,644,700 with the beam operating in a step mode, the poly-methyl methacrylate resist polymer required a beam current of 130 to 150 nanoamps, about twice that needed for the t-butyl methacrylate polymer resist of this invention, to yield a usable resist image. The exposure time saving resulting from using the one pass t-butyl methacrylate resist polymer of this invention is believed clearly evident since in the round beam, 80 microinch — 300na system, a 200 mil square chip was found to require 8 seconds for each exposure cycle. With the methyl methacrylate resist polymer, the actual exposure time per corresponding chip was found to be 16 seconds. As is readily evident, with the t-butyl methacrylate resist polymer, this time is reduced to 8 seconds. At 200 chips per wafer, this means a reduction of actual wafer exposure time from 26.7 minutes to 13.13 minutes.

With the use of a square 15 microinch electron beam in an exposure system of the aforesaid U.S. Pat. No. 3,644,700 it can be seen that with the reduction of the required beam current with t-butyl methacrylate polymer resist, the resultant yields are very substantial with respect to gun life, system stability and reliability, and more accurate and stable control of the square spot shape and size. Alternately, the beam current can be maintained at a normal 130–150 nanoamps and the exposure rate doubled to halve the exposure time per chip.

In raster box sensitometry carried out with a 20,000 Angstrom diameter round electron beam, the following minimum exposure flux (MEF) requirements were obtained in comparison of the t-butyl methacrylate polymer resist and the methyl methacrylate polymer resist.

| Resist | MEF, coul/cm$^2$ For Raster Box Cleanout |
|---|---|
| Poly-methyl methacrylate | $7\text{–}12 \times 10^{-6}$ |
| Poly-t-butyl methacrylate | $3\text{–}6 \times 10^{-6}$ |

As will be understood, these values are to some extent, a function of the developing process, initial resist thickness and final resist thickness after development processing.

In conjunction with the foregoing, it was found in the exposure tests carried out, that a second unexpected and highly advantageous characteristic of the t-butyl methacrylate resist polymer material showed up during chip registry, or alignment, machine cycles. As will be understood, adequate registry in these systems depends on adequate strength, directionality and orientation of electron beam back scatter signals, as a slowly moving electron beam scans (H & V) previously engraved or etched chip registration marks. The typical beam exposure time for the resist registration or alignment marks is 256 microseconds as compared to 2 microseconds in the actual exposure pattern cycle. This results in substantial radiation — caused degradation to the resist material coupled with thermal degradation due to heat evolved in the resist and heat generated below the resist layer by beam penetration and absorption in low thermal conductivity silicon substrates when coated with silicon oxide and glass. Consequently, gases are evolved to the vacuum (of the electron beam environment) in the viscous resist material. With the methyl methacrylate resist polymer, a bubble, wrinkle and partly cross-linked structure results that directionally deflects and/or randomizes the back scatter signals, introducing sufficient noise in the signal so that recognition (e.g., by computer) of the registry signals is quite frequently so badly impaired that registry cannot be accomplished.

With t-butyl methacrylate polymer resist, on chip registry marks, such bubble wrinkle structures were not seen, regardless of the substrate or substrate combinations tested (e.g., copper-aluminum coatings on oxidized surfaces of silicon). In contrast, a smooth, thin resist patch was left where the registry scan was carried out. At the same time, the back scatter signals from the registry marks was found to be of adequate intensity and unimpeded directionality so that automatic registry systems could be operated successfully enabling chip exposure to proceed normally, without machine hangup.

When registry is carried at optimal exposure current for t-butyl methacrylate polymer resist, the registry exposed resist patch developed cleanly away from the registry mark. Under proper exposure conditions for Poly-methyl methacrylate polymer resist, cross-linked insoluble materials were found left on the mark after development which are difficult to strip except by such drastic means as oxygen plasma dry-ashing a procedure which can be deleterious to certain semiconductor devices, such as FETs.

While the invention has been particularly shown and described with reference to preferred embodiments thereof, it will be understood by those skilled in the art that various changes in the steps and details may be made therein without departing from the spirit and scope of the invention.

What is claimed is:

1. A method of forming a polymeric pattern comprising:

A. exposing a film of polymeric material comprised of homopolymers of or copolymers containing at least 25 mole percent of tertiary-butyl methacrylate to an electron beam in a predetermined pattern at sufficient exposure to degrade said material in the exposed areas; and B. removing the degraded products in said exposed areas with a solvent therefore.

2. The method of claim 1 wherein said polymeric material comprises a co-polymer of tertiary-butyl methacrylate and methyl methacrylate.

3. The method of claim 1 wherein said polymeric material consists essentially of poly-tertiary-butyl methacrylate.

4. The method of claim 1 wherein said polymeric material comprises a homopolymer of tertiary-butyl methacrylate.

5. A method of forming a polymeric pattern on a substrate comprising:

A. coating said substrate with a film of polymeric material comprised of homopolymers of or copolymers containing at least 25 mole percent of tertiary-butyl methacrylate;

B. exposing said film in a predetermined pattern at sufficient exposure to degrade said material in the exposed areas; and C. removing the degraded products in the exposed areas with a solvent therefore.

6. The method of claim 5 wherein said polymeric material comprises a co-polymer of tertiary-butyl methacrylate and methyl methacrylate.

7. The method of claim 5 wherein said polymeric material consists essentially of poly-tertiary-butyl methacrylate.

8. The method of claim 5 wherein said polymeric material comprises a homopolymer of tertiary-butyl methacrylate.

9. The method of claim 5 wherein said substrate comprises a semiconductor material.

10. The method of claim 9 wherein said polymeric material comprises a co-polymer of tertiary-butyl methacrylate and methyl methacrylate.

11. The method of claim 9 wherein said polymeric material consists essentially of poly-tertiary-butyl methacrylate.

12. The method of claim 9 wherein said polymeric material comprises a homopolymer of tertiary-butyl methacrylate.

13. The method of claim 5 wherein said substrate comprises a semiconductor device.

14. The method of claim 13 wherein said polymeric material comprises a co-polymer of tertiary-butyl methacrylate and methyl methacrylate.

15. The method of claim 13 wherein said polymeric material consists essentially of poly-tertiary-butyl methacrylate.

16. The method of claim 13 wherein said polymeric material comprises a homopolymer of tertiary-butyl methacrylate.

* * * * *